US012768037B2

(12) United States Patent
Lee et al.

(10) Patent No.: US 12,768,037 B2
(45) Date of Patent: Oct. 20, 2026

(54) SUBSTRATE PROCESSING APPARATUS, CLEANING SUBSTRATE PROCESSING APPARATUS CLEANING METHOD, AND SUBSTRATE PROCESSING METHOD INCLUDING THE SAME

(71) Applicant: SAMSUNG ELECTRONICS CO., LTD., Suwon-si (KR)

(72) Inventors: Woong Lee, Suwon-si (KR); Giduck Kweon, Suwon-si (KR); Taewoo Kim, Suwon-si (KR); Ha-Sung Kim, Suwon-si (KR); Hyouncheol Kim, Suwon-si (KR); Hanearl Jung, Suwon-si (KR); Ahjin Cho, Suwon-si (KR); Chin Moo Cho, Suwon-si (KR); Wooyeon Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 18/658,495

(22) Filed: May 8, 2024

(65) Prior Publication Data

US 2025/0162000 A1 May 22, 2025

(30) Foreign Application Priority Data

Nov. 20, 2023 (KR) ........................ 10-2023-0160658

(51) Int. Cl.
*C23C 16/44* (2006.01)

(52) U.S. Cl.
CPC ................................ *C23C 16/4405* (2013.01)

(58) Field of Classification Search
CPC .................................................. C23C 16/4405
See application file for complete search history.

(56) References Cited

U.S. PATENT DOCUMENTS

| | | | | |
|---|---|---|---|---|
| 8,809,195 B2 | 8/2014 | Elers | | |
| 9,533,332 B2 | 1/2017 | Sun et al. | | |
| 10,283,369 B2 | 5/2019 | Clark et al. | | |
| 11,658,042 B2 | 5/2023 | Fung et al. | | |
| 2002/0190024 A1* | 12/2002 | Eguchi | C23C 16/4405 | 118/724 |
| 2005/0108892 A1* | 5/2005 | Wu | C23C 16/4405 | 134/1 |

(Continued)

FOREIGN PATENT DOCUMENTS

| | | |
|---|---|---|
| KR | 10-1070666 B1 | 10/2011 |
| KR | 10-2023-0084365 A | 6/2023 |
| WO | WO2025070066 A1 * | 4/2025 |

*Primary Examiner* — Kaj K Olsen
*Assistant Examiner* — Richard Z. Zhang
(74) *Attorney, Agent, or Firm* — Sughrue Mion, PLLC

(57) ABSTRACT

A substrate processing apparatus cleaning method includes: inserting a boat into a process tube; removing, by performing a first removal process, a first material deposited in the process tube; and removing, by performing a second removal process, a second material deposited in the process tube by the first removal process, wherein the first removal process includes supplying the process tube with a first gas, wherein the second removal process includes supplying the process tube with a second gas, wherein one of the first gas and the second gas includes a chlorine-based gas, and wherein the other of the first gas and the second gas includes a fluorine-based gas.

20 Claims, 20 Drawing Sheets

(56) References Cited

U.S. PATENT DOCUMENTS

| | | | | |
|---|---|---|---|---|
| 2006/0162861 | A1* | 7/2006 | O'Meara | C03C 17/001 156/345.24 |
| 2008/0014758 | A1* | 1/2008 | Chou | C23C 16/452 438/761 |
| 2009/0071505 | A1 | 3/2009 | Miya et al. | |
| 2009/0233454 | A1* | 9/2009 | Okada | C23C 16/345 438/791 |
| 2010/0035437 | A1* | 2/2010 | Yamazaki | C23C 16/405 118/724 |
| 2010/0087068 | A1* | 4/2010 | Ishibashi | C23C 16/4405 438/758 |
| 2010/0167541 | A1* | 7/2010 | Kato | C23C 16/345 438/694 |
| 2010/0189927 | A1* | 7/2010 | Sato | C23C 16/4405 118/728 |
| 2014/0179106 | A1 | 6/2014 | Zhong et al. | |
| 2021/0305058 | A1 | 9/2021 | Ogawa et al. | |
| 2023/0402281 | A1* | 12/2023 | Koshi | H01L 21/0228 |
| 2025/0115993 | A1* | 4/2025 | Hanashima | C23C 16/4412 |

* cited by examiner

SUBSTRATE PROCESSING APPARATUS, CLEANING SUBSTRATE PROCESSING APPARATUS CLEANING METHOD, AND SUBSTRATE PROCESSING METHOD INCLUDING THE SAME

CROSS-REFERENCE TO RELATED APPLICATION

This application is based on and claim priority under 35 U.S.C § 119 to Korean Patent Application No. 10-2023-0160658, filed on Nov. 20, 2023 in the Korean Intellectual Property Office, the disclosure of which is incorporated by reference herein in its entirety.

BACKGROUND

The disclosure relates to a substrate processing apparatus, a substrate processing apparatus cleaning method, and a substrate processing method including the same. More particularly, the disclosure relates to a substrate processing apparatus capable of removing a material deposited therein, a substrate processing apparatus cleaning method, and a substrate processing method including the same.

A semiconductor device may be fabricated through various processes. For example, a semiconductor device may be manufactured by a deposition process, a photolithography process, an etching process, and a cleaning process that are performed on a substrate. Various kinds of substrate processing apparatus may be used for diverse process of a substrate. In a deposition process, vertical furnace type batch facilities may be utilized for deposition. In batch facilities, a process may be performed in a state where a plurality of substrates are vertically stacked. For example, a gas may be introduced to batch facilities into which a plurality of substrates are inserted, and a deposition process may be performed on the plurality of substrates at the same time.

SUMMARY

Provided are a substrate processing apparatus allowing a process on a substrate to remove a material deposited in a tube, a substrate processing apparatus cleaning method, and a substrate processing method including the same.

Provided are a substrate processing apparatus capable of removing other deposited materials occurring in the middle of removing a material deposited in a tube, a substrate processing apparatus cleaning method, and a substrate processing method including the same.

Provided are a substrate processing apparatus capable of reducing a time required for cleaning procedure, a substrate processing apparatus cleaning method, and a substrate processing method including the same.

The aspects of the disclosure are not limited to the mentioned above, and other objects which have not been mentioned above will be clearly understood to those skilled in the art from the following description.

According to an aspect of the disclosure, a substrate processing apparatus cleaning method includes: inserting a boat into a process tube; removing, by performing a first removal process, a first material deposited in the process tube; and removing, by performing a second removal process, a second material deposited in the process tube by the first removal process, wherein the first removal process includes supplying the process tube with a first gas, wherein the second removal process includes supplying the process tube with a second gas, wherein one of the first gas and the second gas includes a chlorine-based gas, and wherein the other of the first gas and the second gas includes a fluorine-based gas.

According to an aspect of the disclosure, a substrate processing method includes: processing a first substrate by using a substrate processing apparatus; and after processing the first substrate, cleaning the substrate processing apparatus, wherein the cleaning the substrate processing apparatus includes: supplying a first gas to the substrate processing apparatus from which the first substrate is unloaded, wherein the first gas includes a chlorine-based gas; after the supplying the first gas, removing the first gas from the substrate processing apparatus by supplying the substrate processing apparatus with a purge gas; and after the removing the first gas, supplying the substrate processing apparatus with a second gas, wherein the second gas includes a fluorine-based gas.

According to an aspect of the disclosure, a substrate processing apparatus includes: a process tube comprising a process area; a boat selectively inserted into the process area; at least one process gas nozzle comprising a plurality of process gas holes vertically spaced apart from each other; a cleaning gas nozzle comprising a plurality of cleaning gas holes vertically spaced apart from each other; a process gas tank connected to the at least one process gas nozzle and configured to supply the at least one process gas nozzle with a process gas; and a cleaning gas tank connected to the cleaning gas nozzle and configured to supply the cleaning gas nozzle with a cleaning gas, wherein the cleaning gas tank is configured to store a chlorine-based gas and a fluorine-based gas.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EMBODIMENTS

Figure 1:
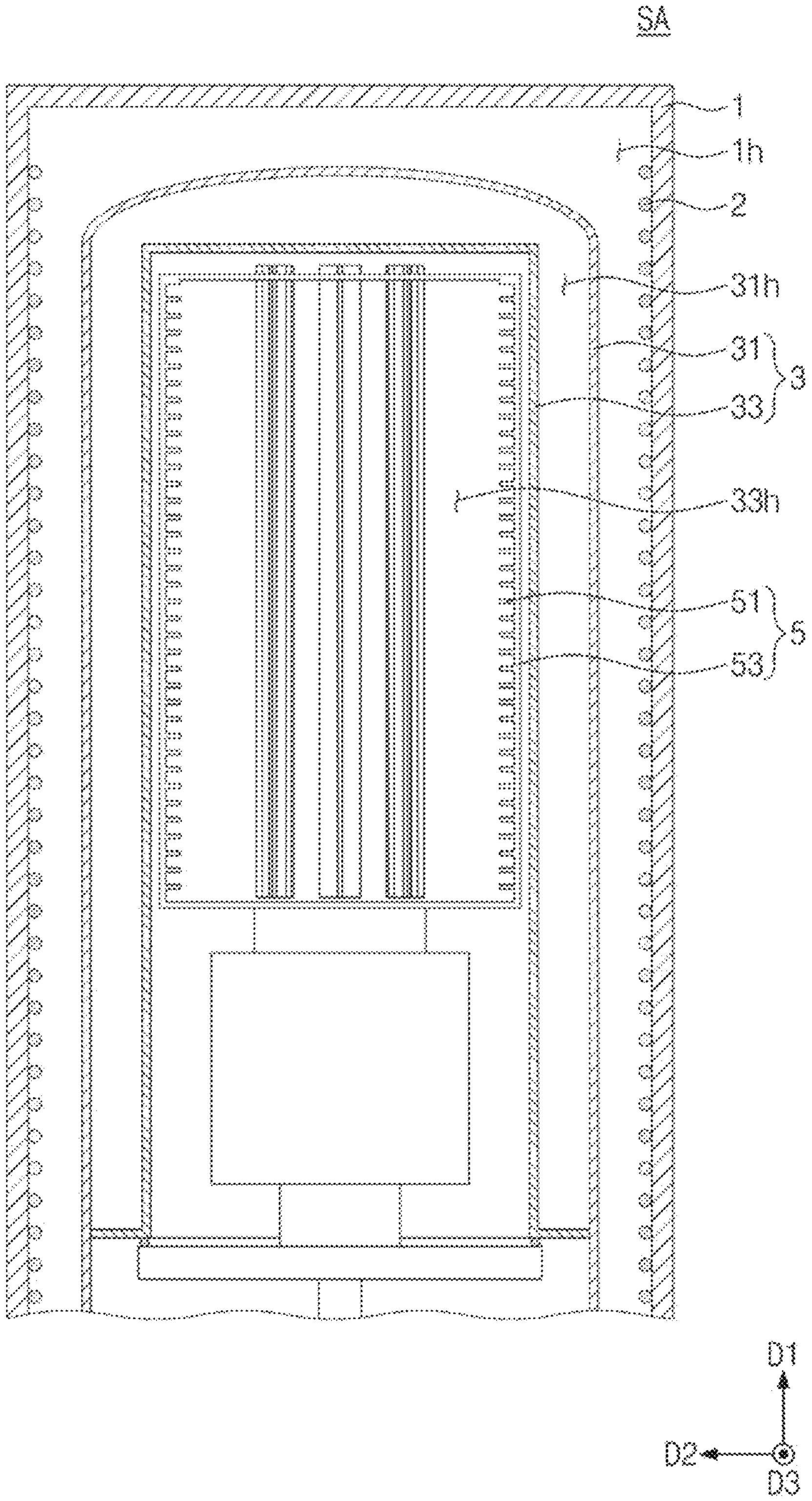
FIG. 1 illustrates a cross-sectional view showing a substrate processing apparatus according to some embodiments of the disclosure.

The following will now describe some embodiments of the disclosure with reference to the accompanying drawings. Like reference numerals may indicate like components throughout the description.

The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. As an additional example, the expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

Figure 2:
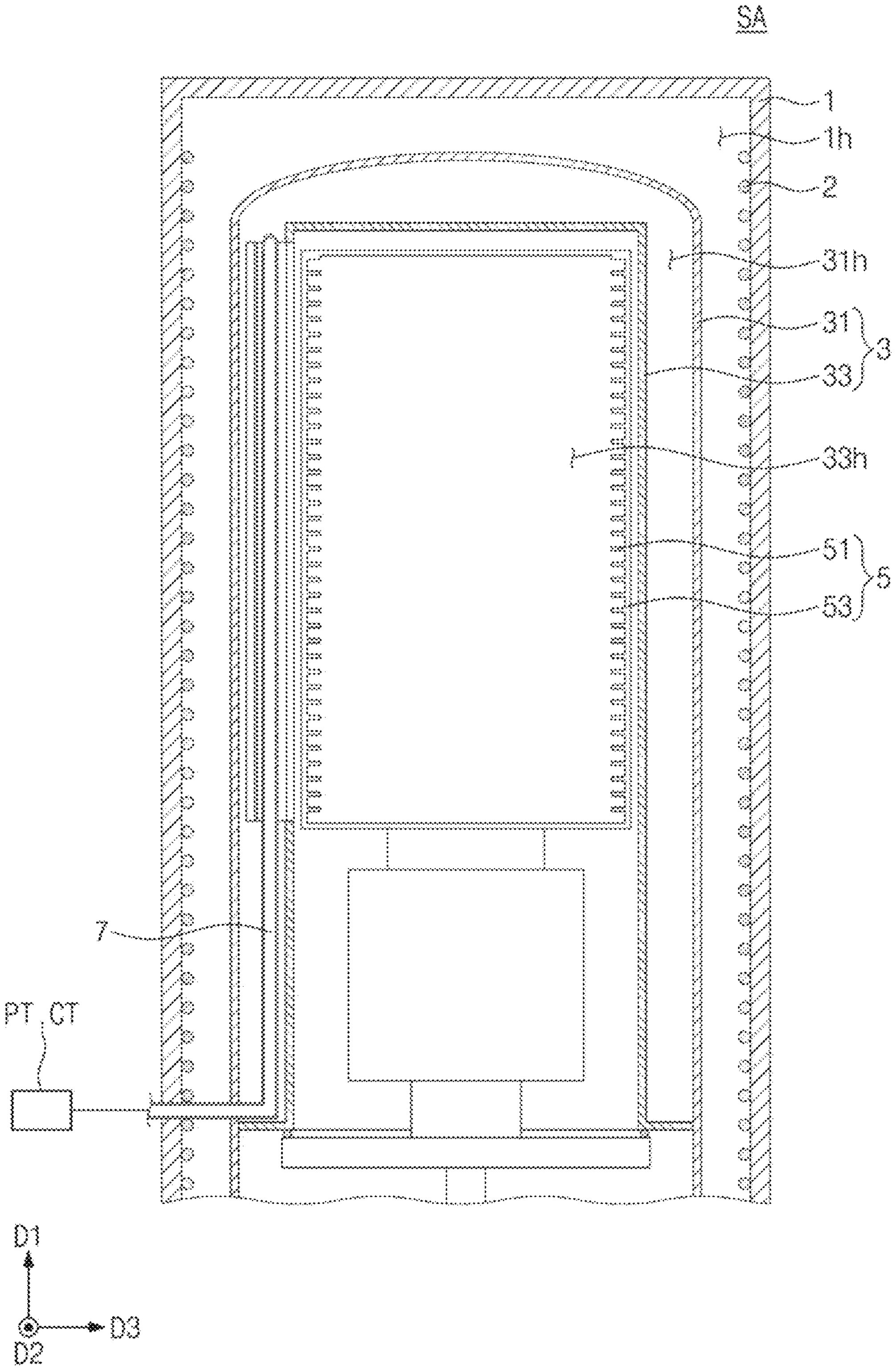
FIG. 2 illustrates a cross-sectional view showing a substrate processing apparatus according to some embodiments of the disclosure.

FIG. 1 illustrates a cross-sectional view showing a substrate processing apparatus according to some embodiments of the disclosure. FIG. 2 illustrates a cross-sectional view showing a substrate processing apparatus according to some embodiments of the disclosure.

In this disclosure, symbol D1 may indicate a first direction, symbol D2 may indicate a second direction that intersects the first direction D1, and symbol D3 may indicate a third direction that intersects each of the first direction D1 and the second direction D2. The first direction D1 may be called a vertical direction. In addition, each of the second direction D2 and the third direction D3 may be called a horizontal direction.

FIGS. 1 and 2 illustrate a substrate processing apparatus SA. The substrate processing apparatus SA may perform a deposition process on a substrate. A term "substrate" used in this description may denote a silicon (Si) wafer, but the disclosure is not limited thereto. The substrate processing apparatus SA may perform a deposition process on a plurality of substrates at the same time. The substrate processing apparatus SA may include a process chamber 1, a heater 2, a process tube 3, a boat 5, a nozzle 7, a process gas tank PT, and a cleaning gas tank CT.

The process chamber 1 may provide a chamber area 1*h*. The chamber area 1*h* may be selectively separated from an external area. The chamber area 1*h* may vertically extend.

The process tube 3 may be positioned in the process chamber 1. For example, the process tube 3 may be positioned in the chamber area 1*h*. The process tube 3 may provide a process area where a deposition process may be performed on a substrate. The process tube 3 may be provided in plural. For example, the process tube 3 may include an outer tube 31 and an inner tube 33.

The outer tube 31 may provide an outer process area 31*h*. The outer tube 31 may vertically extend. The outer tube 31 may include quartz, but the disclosure is not limited thereto.

The inner tube 33 may be positioned in the outer tube 31. For example, the outer tube 31 may surround the inner tube 33. The inner tube 33 may provide an inner process area 33*h*. The inner tube 33 may divide the process area into the outer process area 31*h* and the inner process area 33*h*. The inner tube 33 may vertically extend. The boat 5 may be selectively inserted into the inner tube 33. The inner tube 33 may include quartz, but the disclosure is not limited thereto.

The heater 2 may heat the process tube 3. The heater 2 may be disposed in the chamber area 1*h*. For example, the heater 2 may be combined with an inner surface of the process chamber 1. For example, the heater 2 may be positioned outside the process tube 3. The heater 2 may include a hot wire, but the disclosure is not limited thereto.

The boat 5 may be selectively inserted into the process tube 3. For example, when the boat 5 moves upwards, the boat 5 may be inserted into the inner tube 33. The boat 5 may support a substrate. For example, the boat 5 may support a plurality of substrates. A plurality of substrates supported on the boat 5 may be arranged vertically spaced apart from each other. The boat 5 may include a substrate support member 51 and a boat body 53. The substrate support member 51 may support a substrate. For example, a substrate may be disposed on a top surface of the substrate support member 51. The substrate support member 51 may be disposed in plural. That is, the plurality of substrate support members 51 may be arranged vertically spaced apart from each other. One of the plurality of substrate support member 51 will be discussed below. The boat body 53 may support the substrate support member 51. The boat body 53 may vertically extend.

The nozzle 7 may spray a gas toward a substrate on the boat 5. For example, the nozzle 7 may spray a process gas and/or a cleaning gas toward a substrate disposed on the boat 5. The nozzle 7 may be connected to the process gas tank PT and/or the cleaning gas tank CT. The nozzle 7 may vertically extend. At least a portion of the nozzle 7 may be positioned in the process chamber 1. For example, at least a portion of the nozzle 7 may be placed in the process tube 3. At least a portion of the nozzle 7 may be disposed between the outer tube 31 and the inner tube 33. In an embodiment, the nozzle 7 is of a long type or a vertically extending type, but the disclosure is not limited thereto. For example, the nozzle 7 may be of a short type. The nozzle 7 may be provided in plural. The plurality of nozzles 7 may be disposed spaced apart from each other in the horizontal direction. A detailed description thereof will be further discussed below.

The process gas tank PT may supply the process tube 3 with a process gas. The process gas tank PT may store the process gas. For example, the process gas tank PT may store at least one of a deposition gas, nitrogen ($N_2$) gas, and ozone ($O_3$) gas. A detailed description thereof will be further discussed below.

The cleaning gas tank CT may supply the process tube 3 with a cleaning gas. The cleaning gas may remove a material deposited in the substrate processing apparatus SA. For example, the cleaning gas may remove at least one of aluminum oxide ($Al_2O_3$), boric oxide ($B_2O_3$), hafnium (IV) oxide ($HfO_2$), and hafnium fluoride ($HfF_4$) deposited in the process tube 3. The cleaning gas tank CT may store the cleaning gas. For example, the cleaning gas tank CT may store at least one of a chlorine-based gas and a fluorine-based gas. The chlorine-based gas may include at least one selected from a boron trichloride ($BCl_3$) gas, a titanium (III) chloride ($TiCl_3$) gas, and a dimethylaluminum chloride ($AlCl(CH_3)_2$) gas. The fluorine-based gas may include at least one selected from a nitrogen trifluoride ($NF_3$) gas, a hydrogen fluoride (HF) gas, a xenon difluoride ($XeF_2$) gas, and a sulfur tetrafluoride ($SF_4$) gas. A detailed description thereof will be further discussed below.

Figure 3:
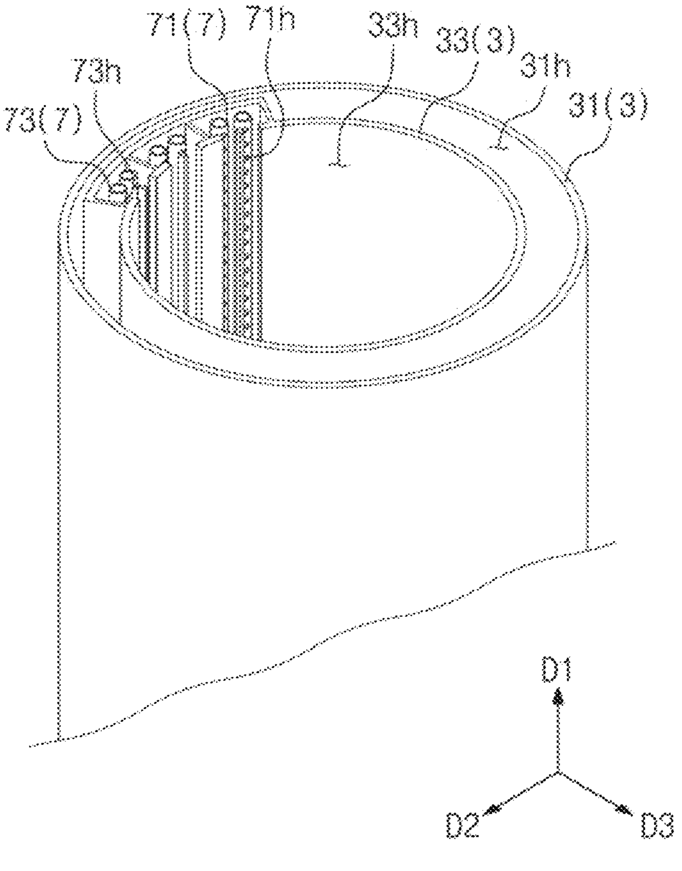
FIG. 3 illustrates a cutoff perspective view showing a substrate processing apparatus according to some embodiments of the disclosure.
Figure 4:
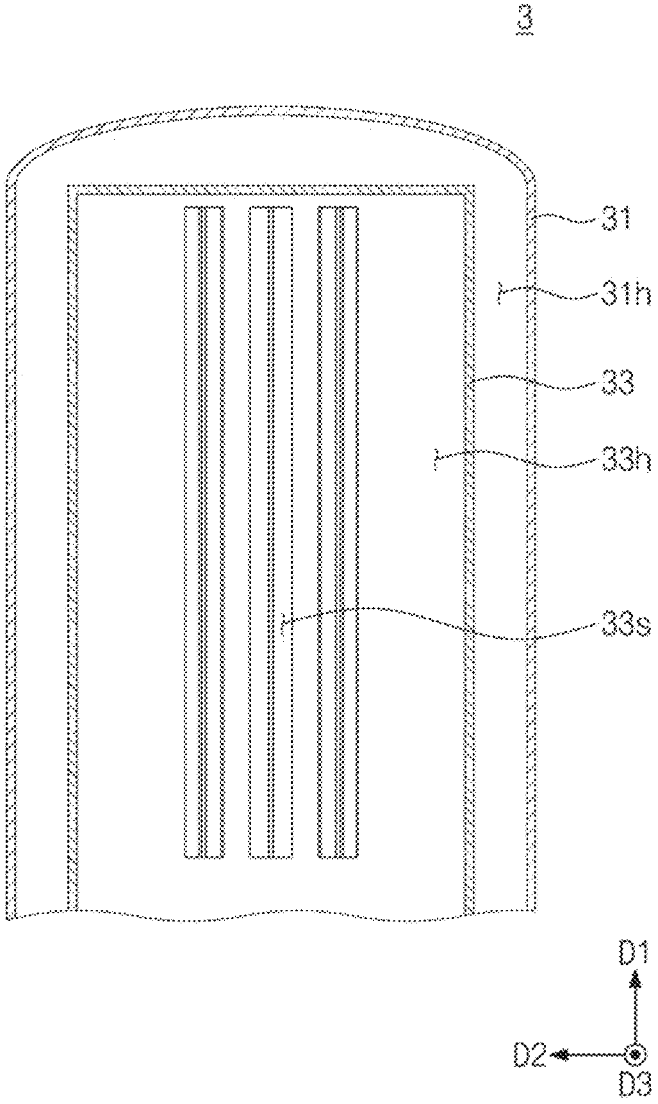
FIG. 4 illustrates a cross-sectional view showing a process tube according to some embodiments of the disclosure.
Figure 5:
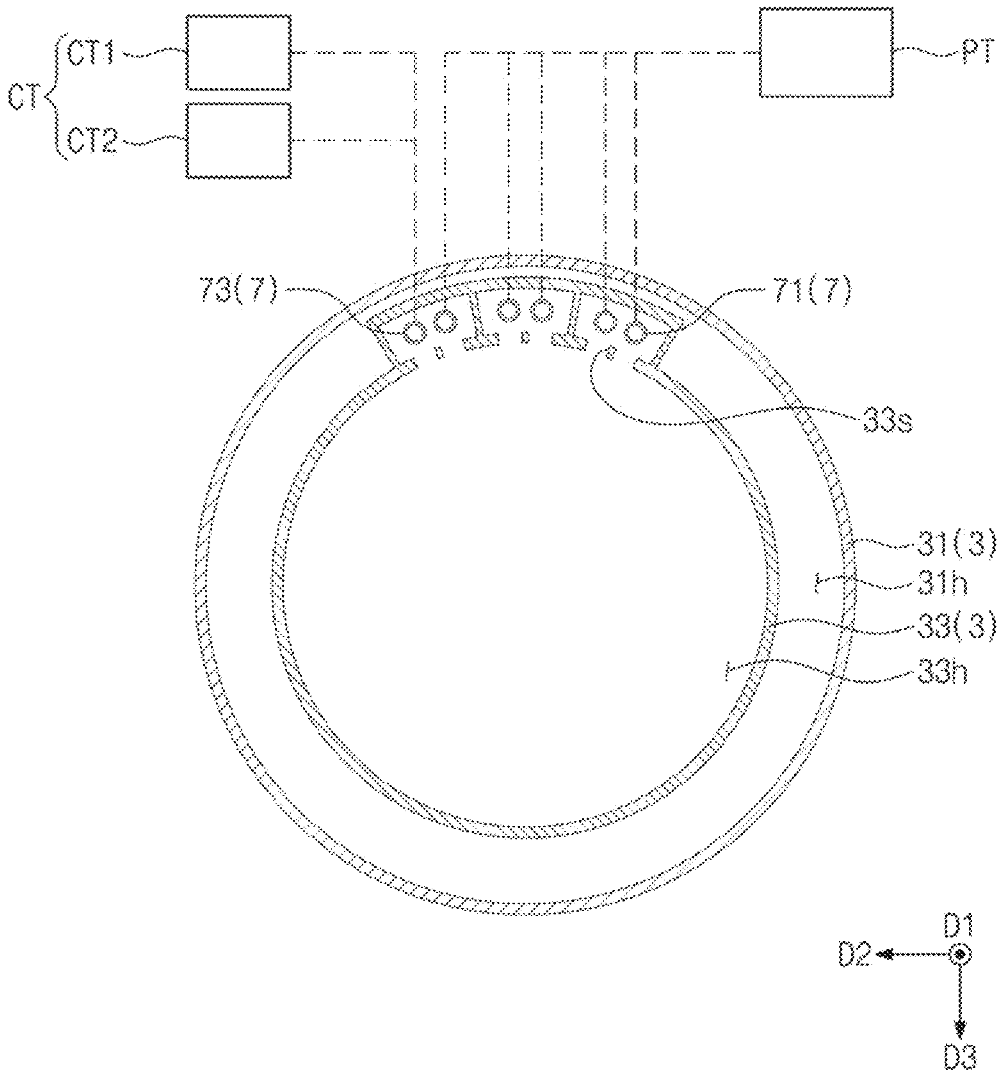
FIG. 5 illustrates a plan view showing a substrate processing apparatus according to some embodiments of the disclosure.

FIG. 3 illustrates a cutoff perspective view showing a substrate processing apparatus according to some embodiments of the disclosure. FIG. 4 illustrates a cross-sectional view showing a process tube according to some embodiments of the disclosure. FIG. 5 illustrates a plan view showing a substrate processing apparatus according to some embodiments of the disclosure.

Referring to FIGS. 3 to 5, the inner tube 33 may further provide a gas slit 33*s*. The gas slit 33*s* may penetrate in the horizontal direction through the inner tube 33. The gas slit 33*s* may connect an outer area of the inner tube 33 to the inner process area 33*h*. The gas slit 33*s* may extend in the first direction D1. The nozzle 7 may be exposed through the gas slit 33*s* to the inner process area 33*h*. The process gas or the cleaning gas sprayed from the nozzle 7 may be introduced through the gas slit 33*s* into the inner process area 33*h*. The gas slit 33*s* may be provided in plural. In an embodiment, the plurality of gas slits 33*s* may be disposed spaced apart from each other in the horizontal direction. One of the plurality of gas slit 33*s* will be discussed below.

The cleaning gas tank CT may be provided in plural. For example, as shown in FIG. 5, the cleaning gas tank CT may include a first cleaning gas tank CT1 and a second cleaning gas tank CT2. The first cleaning gas tank CT1 may store and supply the chlorine-based gas. The second cleaning gas tank CT2 may storage and store the fluorine-based gas.

The nozzle 7 may be provided in plural. For example, as shown in FIG. 5, the nozzle 7 may include a process gas nozzle 71 and a cleaning gas nozzle 73.

The process gas nozzle 71 may be connected to the process gas tank PT. The process gas supplied from the process gas tank PT may be sprayed through the process gas nozzle 71 to the inner process area 33*h*. The process gas nozzle 71 may provide a plurality of process gas holes 71*h* that are arranged vertically spaced apart from each other. The plurality of process gas holes 71*h* may be connected through the gas slit 33*s* to the inner process area 33*h*. The process gas nozzle 71 may be provided in plural. For example, five or more process gas nozzles 71 may be provided. When viewed based on FIG. 5, five right-side nozzles may each be the process gas nozzle 71. One process gas nozzle 71 will be discussed below.

The cleaning gas nozzle 73 may be connected to the cleaning gas tank CT. For example, the cleaning gas nozzle 73 may be connected to the first cleaning gas tank CT1 and the second cleaning gas tank CT2. The cleaning gas nozzle 73 may be supplied with the chlorine-based gas and the fluorine-based gas from the first cleaning gas tank CT1 and the second cleaning gas tank CT2, respectively. The cleaning gas nozzle 73 may provide a plurality of cleaning gas holes 73*h* that are arranged vertically spaced apart from each other. The plurality of cleaning gas holes 73*h* may be connected through the gas slit 33*s* to the inner process area 33*h*. When viewed based on FIG. 5, one leftmost nozzle may be the cleaning gas nozzle 73. One cleaning gas nozzle 73 may be connected to all of the first cleaning gas tank CT1 and the second cleaning gas tank CT2. One cleaning gas nozzle 73 may spray each of the chlorine-based gas and the fluorine-based gas. The disclosure, however, are not limited thereto, and the cleaning gas nozzle 73 may be provided in plural. For example, two cleaning gas nozzles 73 may be provided. One of the two cleaning gas nozzles 73 may be connected to the first cleaning gas tank CT1. The other of the two cleaning gas nozzles 73 may be connected to the second cleaning gas tank CT2. One cleaning gas nozzle 73 will be discussed below.

Figure 6:
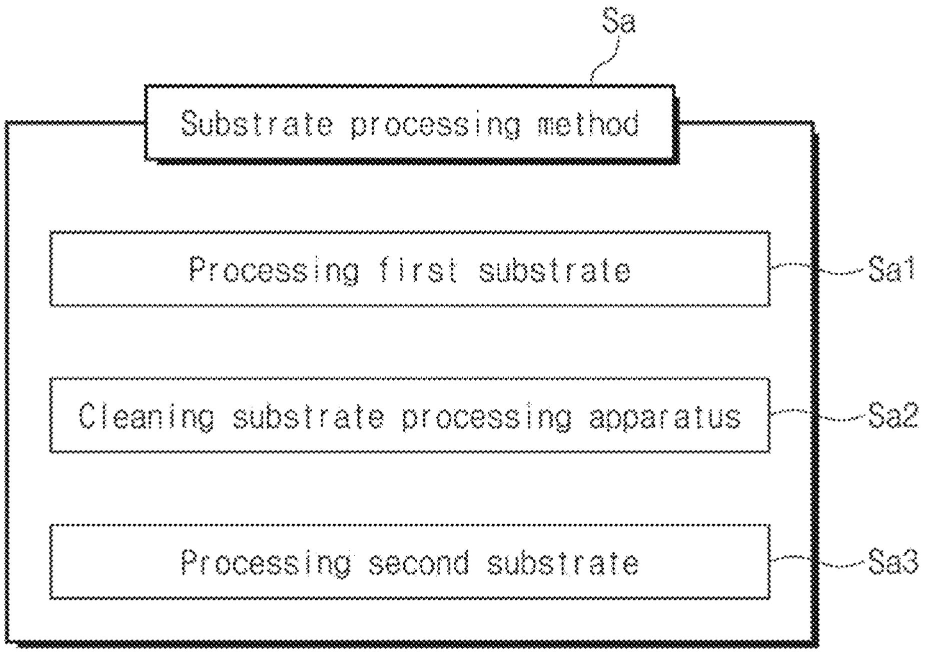
FIG. 6 illustrates a flow chart showing a substrate processing method according to some embodiments of the disclosure.

FIG. 6 illustrates a flow chart showing a substrate processing method according to some embodiments of the disclosure. FIG. 6 illustrates a substrate processing method Sa. The substrate processing method Sa may process a substrate by using the substrate processing apparatus SA discussed with reference to FIGS. 1 to 5. The substrate processing method Sa may include an operation of processing a first substrate (Sa1), an operation of cleaning a substrate processing apparatus (Sa2), and an operation of processing a second substrate (Sa3).

Figure 7:
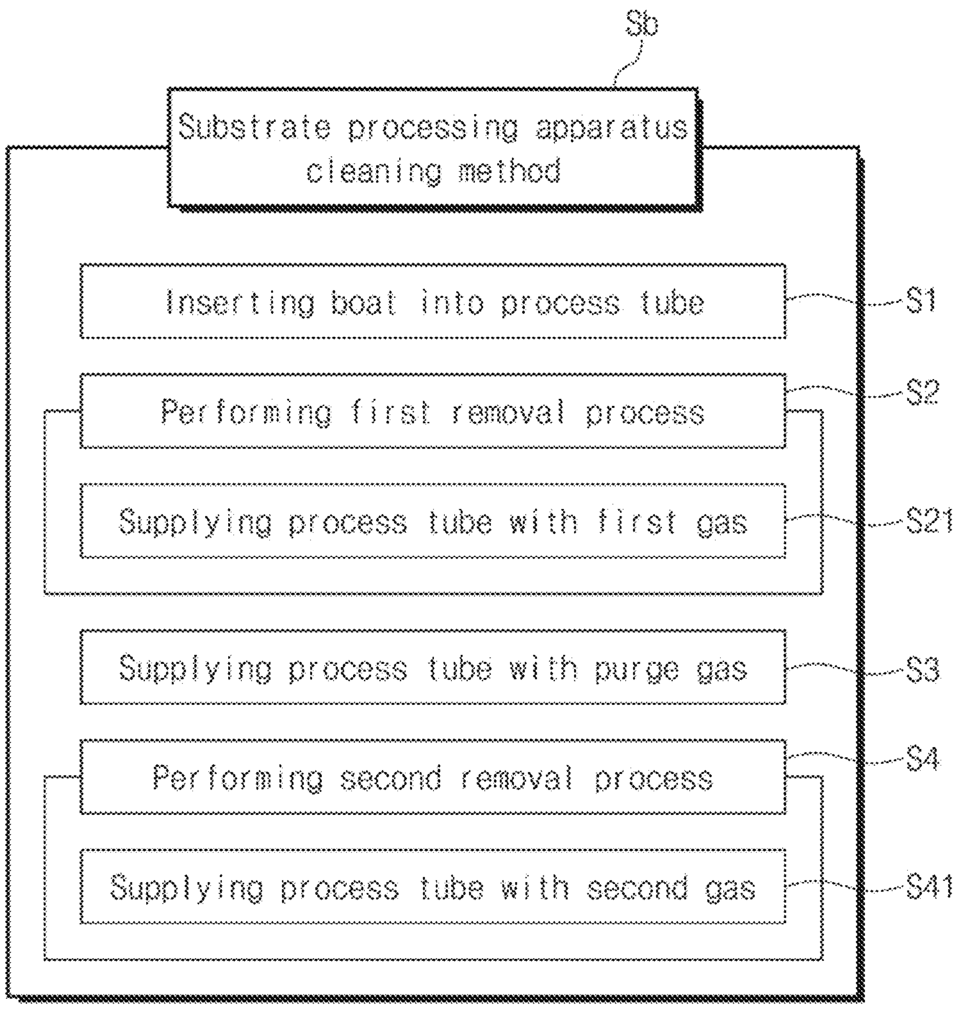
FIG. 7 illustrates a flow chart showing a substrate processing apparatus cleaning method according to some embodiments of the disclosure.

FIG. 7 illustrates a flow chart showing a substrate processing apparatus cleaning method according to some embodiments of the disclosure. FIG. 7 illustrates a substrate processing apparatus cleaning method Sb.

The substrate processing apparatus cleaning method Sb may perform the cleaning operation Sa2 discussed with reference to the flow chart of FIG. 6. For example, the substrate processing apparatus cleaning operation Sa2 of FIG. 6 may be performed by the substrate processing apparatus cleaning method Sb of FIG. 7. The substrate processing apparatus cleaning method Sb may include an operation of inserting a boat into a process tube (S1), an operation of performing a first removal process (S2), an operation of supplying the process tube with a purge gas (S3), and an operation of performing a second removal process (S4).

The first removal operation S2 may include an operation of supplying the process tube with a first gas (S21). The second removal operation S4 may include an operation of supplying the process tube with a second gas (S41).

The substrate processing method Sa of FIG. 6 and the substrate processing apparatus cleaning method Sb of FIG. 7 will be discussed below in detail with reference to FIGS. 8 to 18.

FIGS. 8 to 17 illustrate diagrams showing a substrate processing method according to the flow chart of FIG. 6.

Figure 8:
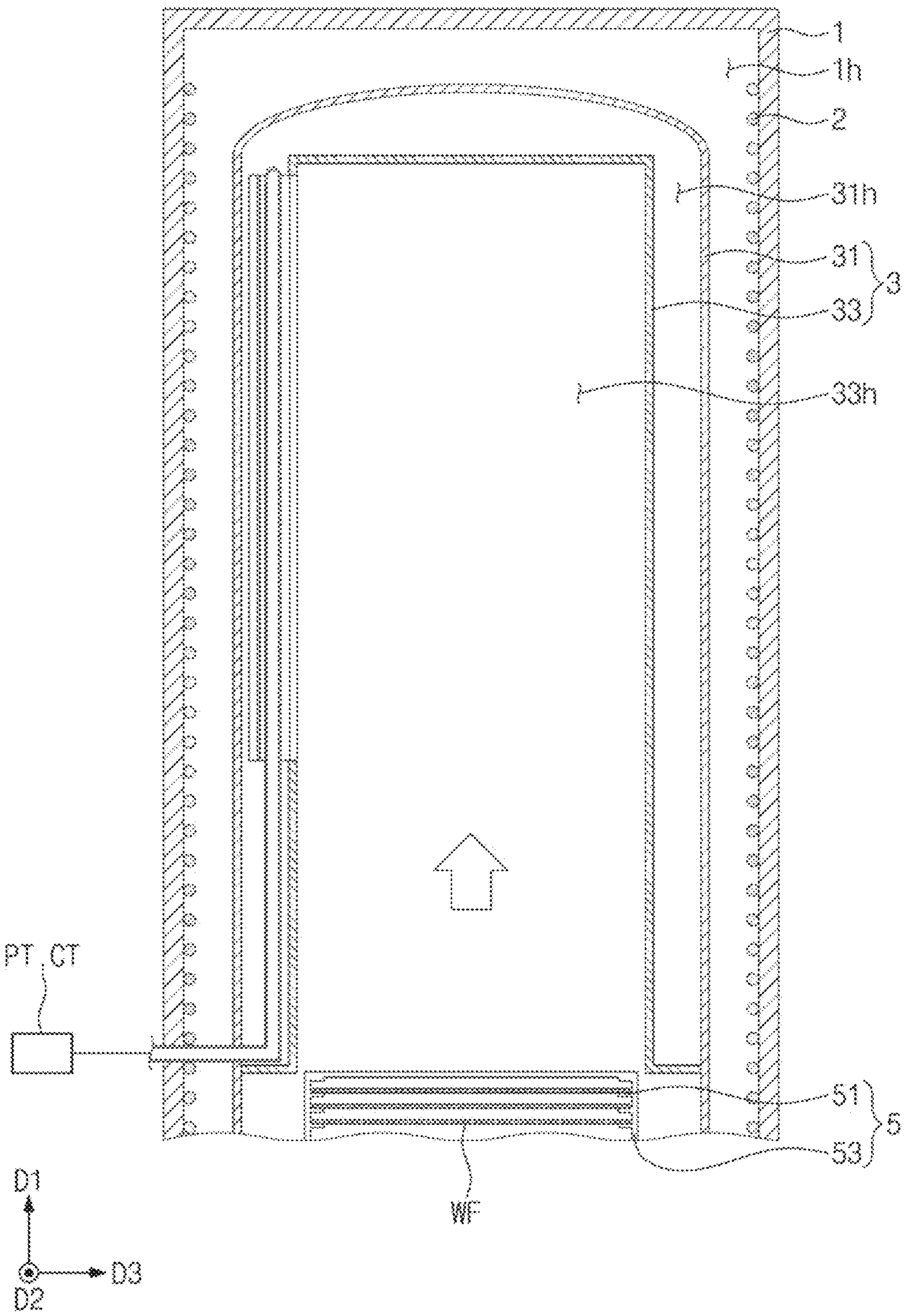
FIGS. 8 to 17 illustrate diagrams showing a substrate processing method according to the flow chart of FIG. 6.
Figure 9:
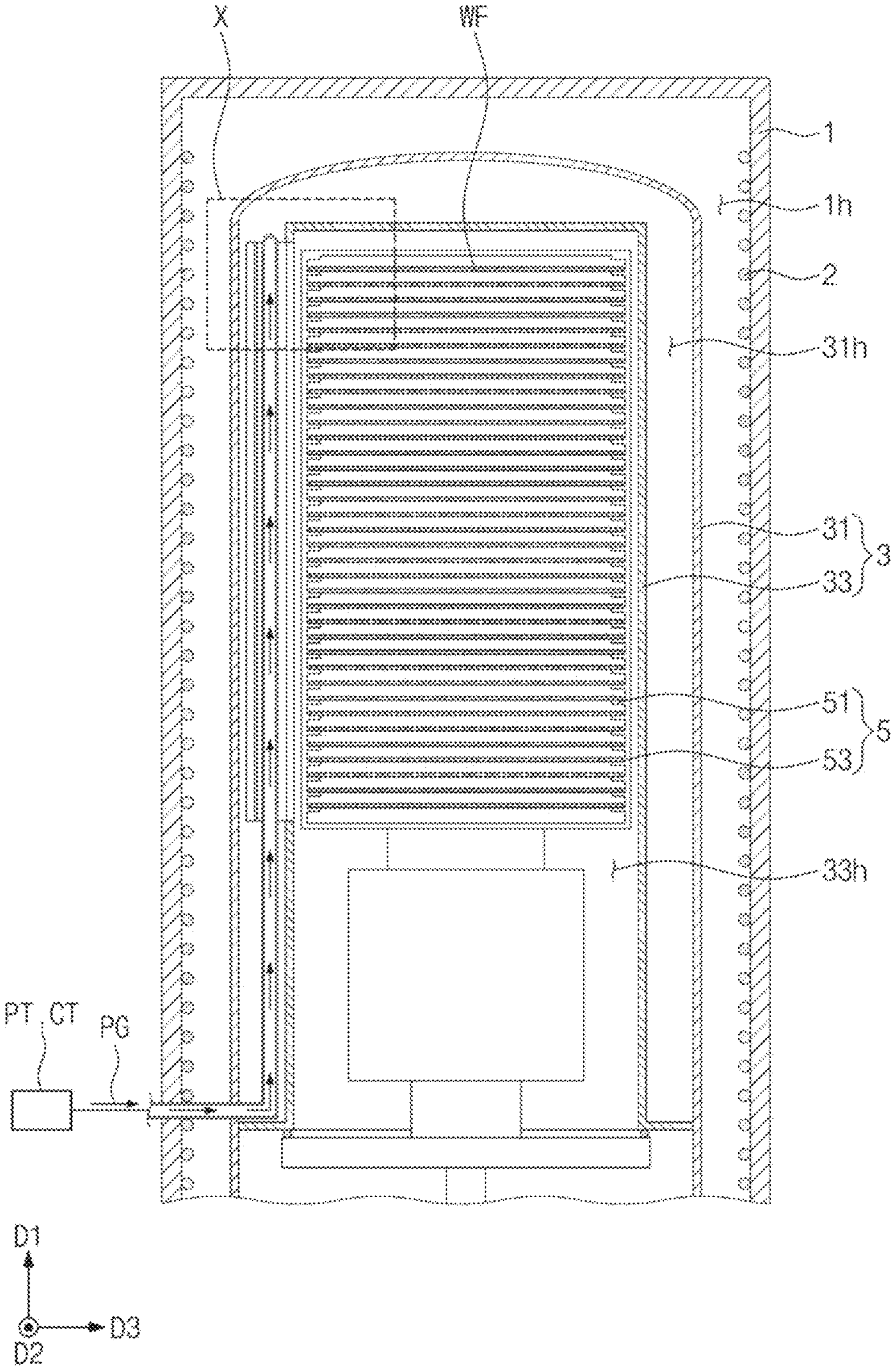

Referring to FIGS. 6, 8, and 9, the first substrate processing operation Sa1 may include an operation of receiving, by the process tube 3, the boat 5 on which a first substrate WF is disposed. For example, a plurality of first substrates WF may be disposed on the boat 5. A single first substrate WF will be discussed below. As the boat 5 moves upwards, the first substrate WF may be disposed in an area defined by the process tube 3.

Figure 10:
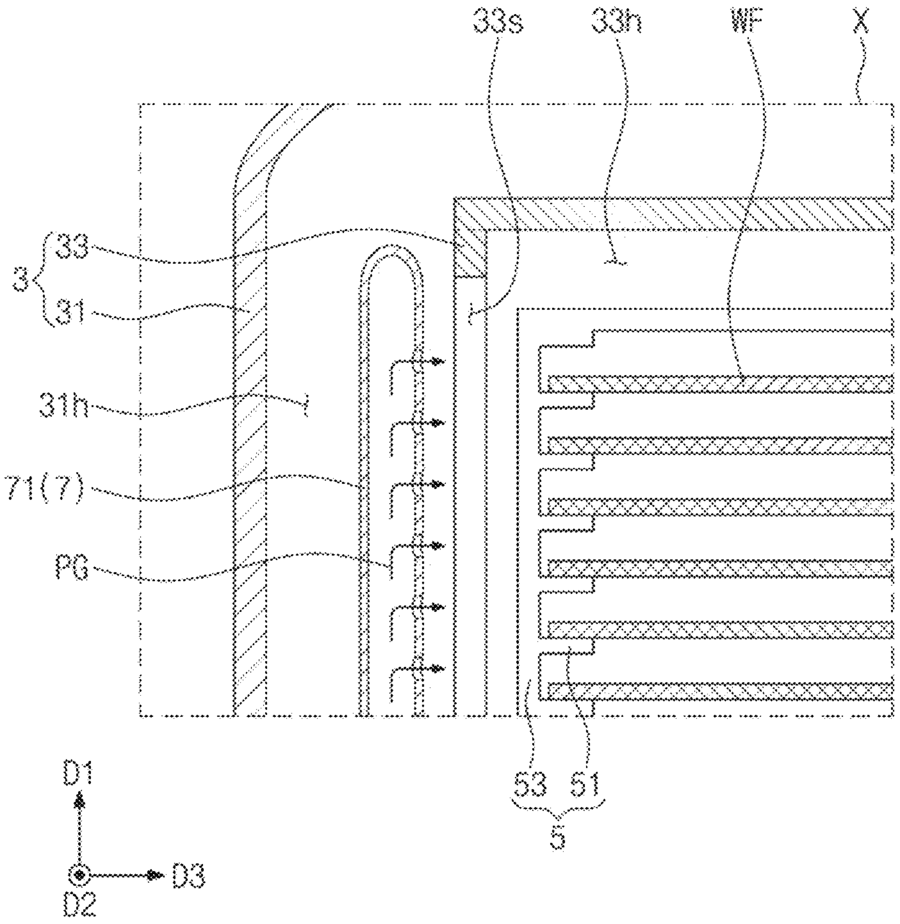
Figure 11:
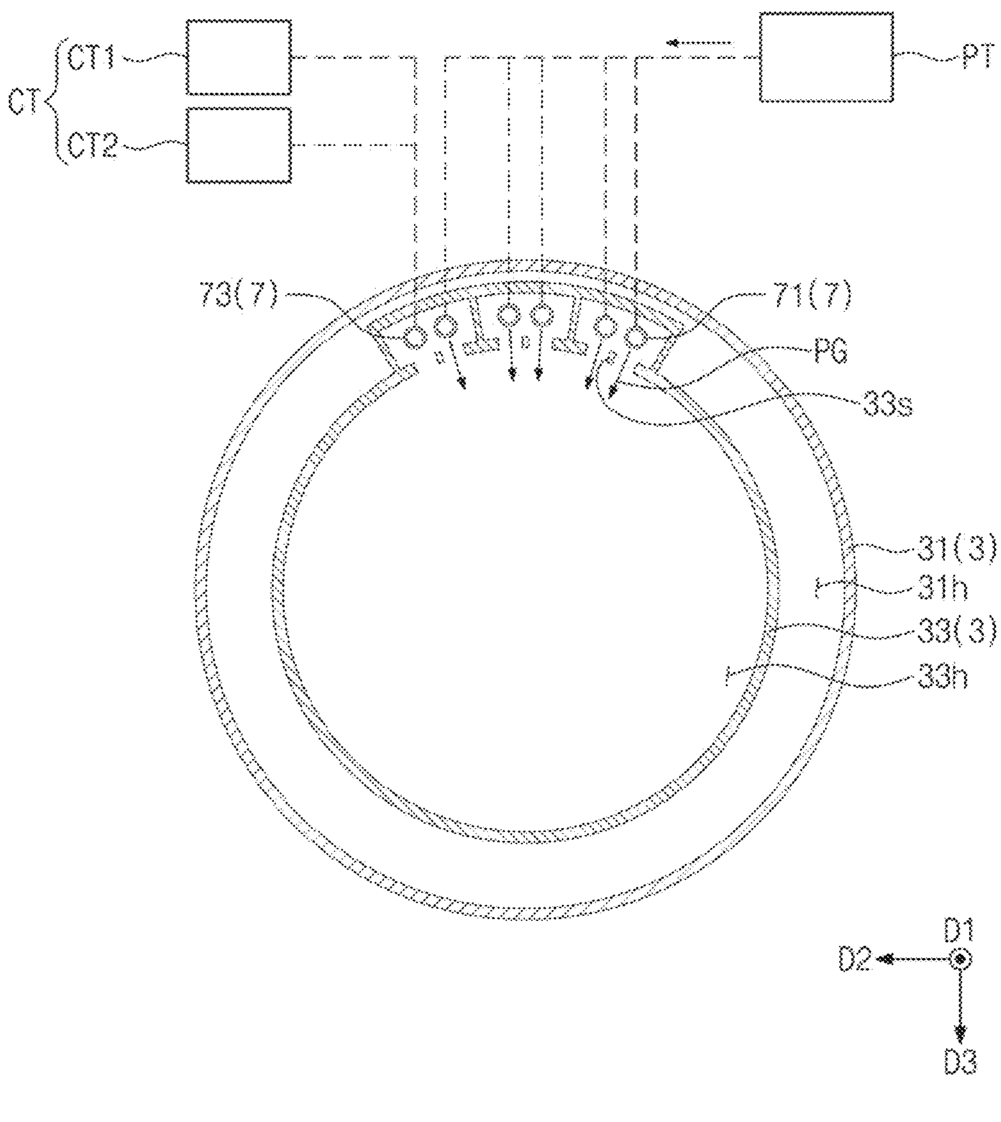

Referring to FIGS. 10 and 11, the process gas PG may be supplied into the inner tube 33 through the process gas nozzle 71 from the process gas tank PT. In an embodiment, the process gas PG may include a deposition gas, such as at least one of a nitrogen ($N_2$) gas and an ozone ($O_3$) gas, including a material which will be deposited on the first substrate WF. The process gas PG may be sequentially sprayed a plurality of times. As the process gas PG reaches the first substrate WF, a deposition layer may be formed on the first substrate WF. The operation Sa1 of processing the first substrate WF may be performed at a second temperature. The second temperature may range, for example, from about 100° C. to about 400° C. During this procedure, a deposition material may also be formed in the process tube 3. For example, the deposition material may be formed on an inner surface of the inner tube 33. The deposition material may include, for example, at least one of aluminum oxide ($Al_2O_3$) and hafnium (IV) oxide ($HfO_2$). A detailed description of the procedure will be further discussed below.

After the first substrate WF is processed, the boat 5 may move downwards. For example, the boat 5 may be released from the process tube 3. The first substrate WF may be unloaded from the boat 5. For example, the first substrate WF may be unloaded from the substrate processing apparatus SA.

Figure 12:
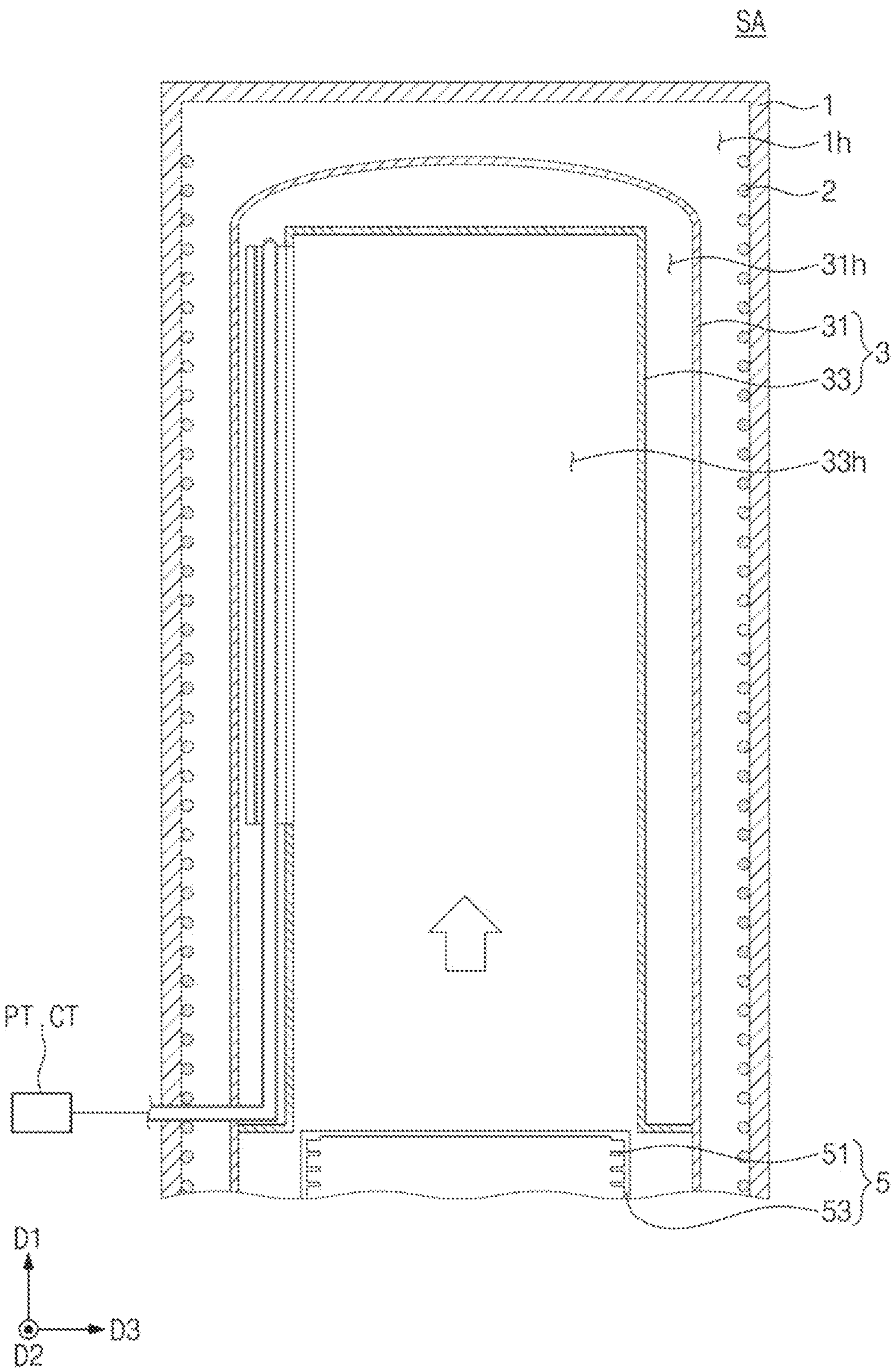
Figure 13:
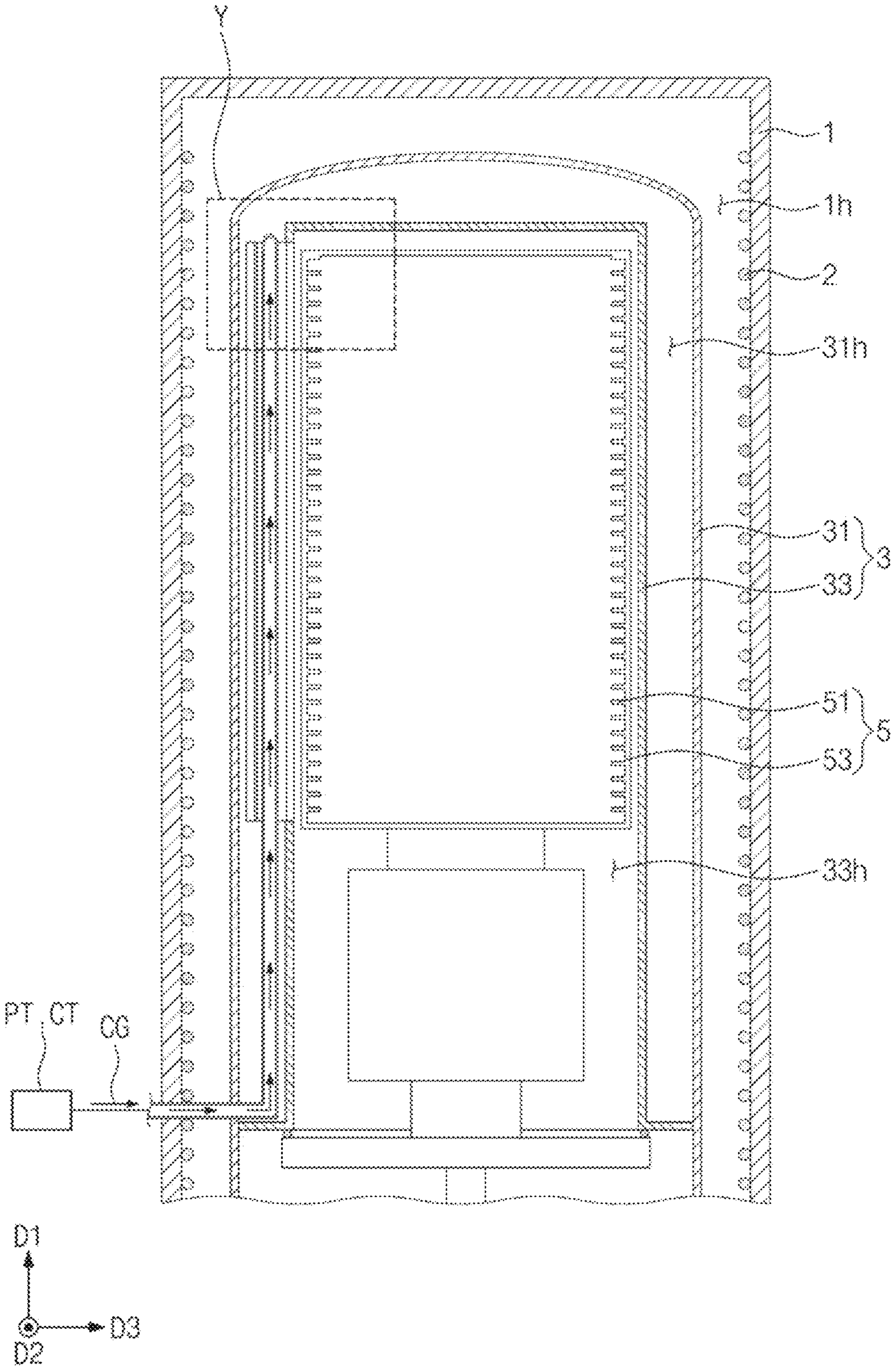
Figure 14:
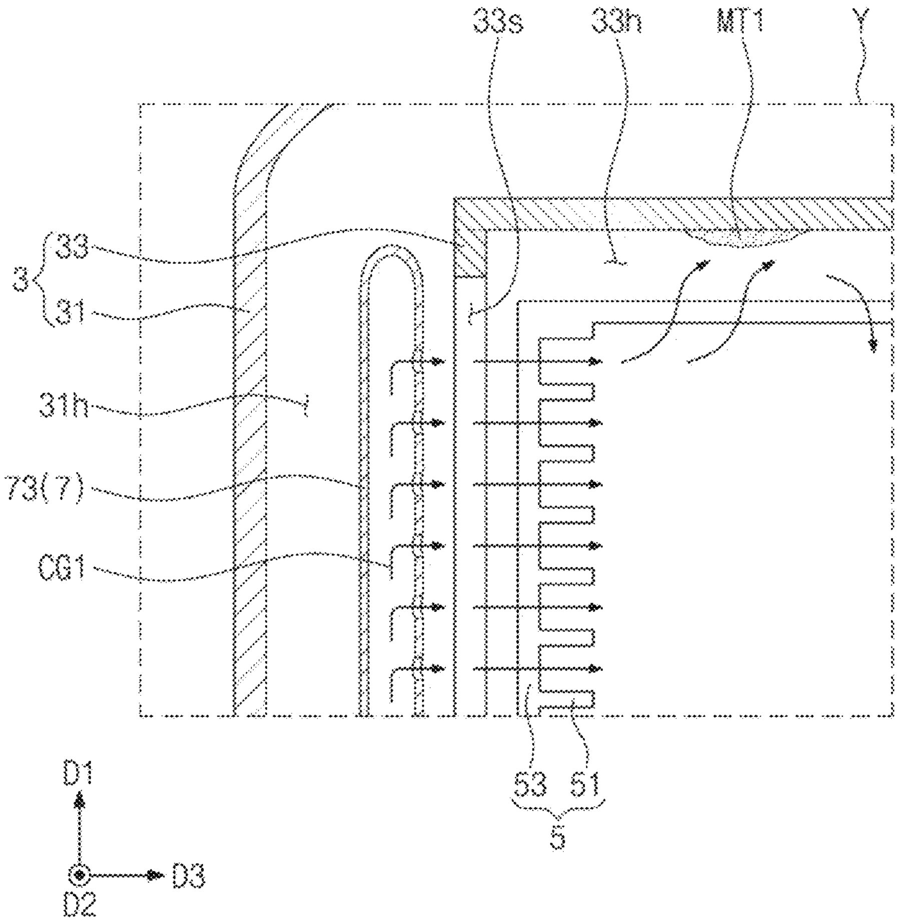
Figure 15:
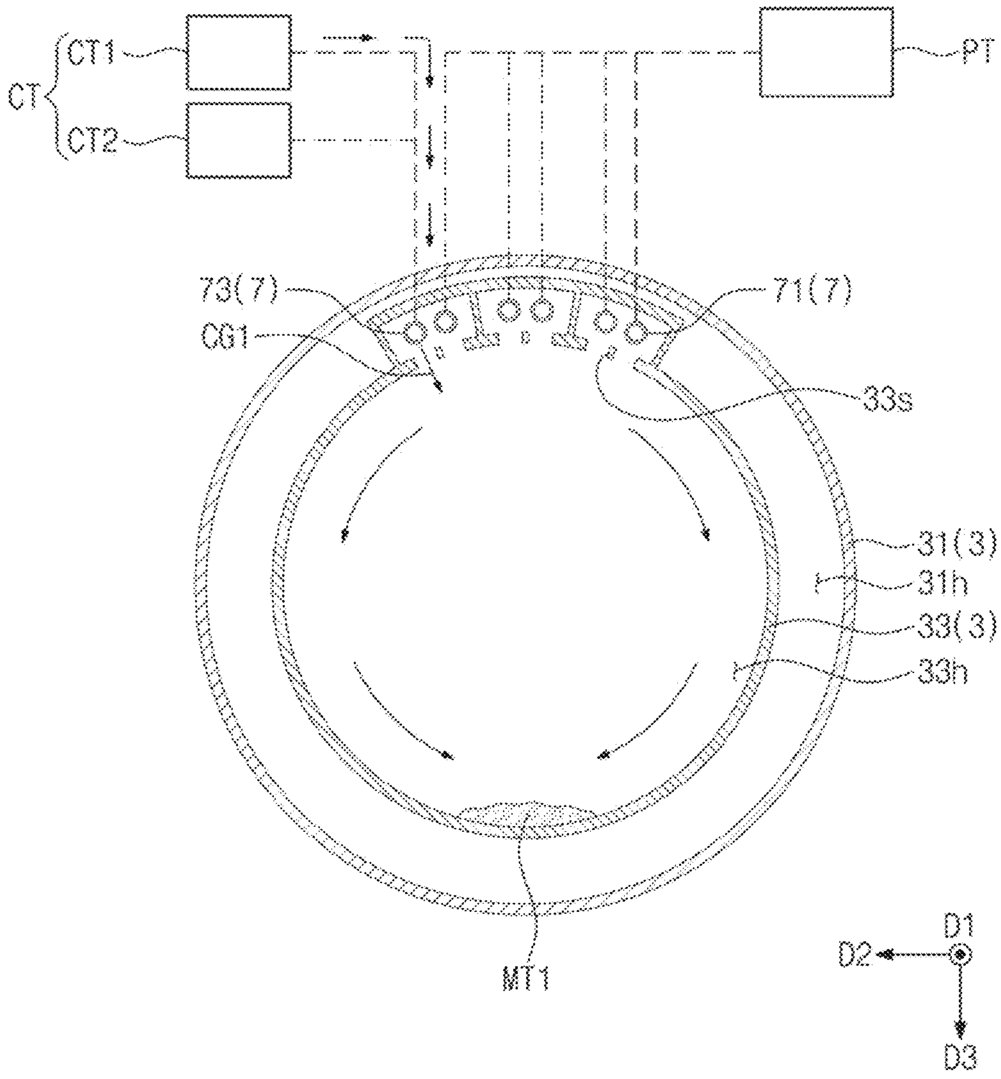

Referring to FIGS. 7, 12, and 13, the boat insertion operation S1 may include an operation of allowing the process tube 3 to receive the boat 5 from which the first substrate WF is unloaded. The first substrate WF may not be disposed on the boat 5 received in the process tube 3. For example, in the boat insertion operation S1, no substrate may be present on the boat 5 inserted into the process tube 3. The disclosure, however, are not limited thereto, and in the boat insertion operation S1, a dummy substrate may be present on the boat 5 inserted into the process tube 3.

Referring to FIGS. 7, 13, 14, and 15, the first gas supplying operation S21 may include an operation of allowing the process tube 3 to receive a first gas CG1 supplied through the cleaning gas nozzle 73 from the first cleaning gas tank CT1. The first gas CG1 may be a cleaning gas. The first gas CG1 may include, for example, a chlorine-based gas. For further example, the first gas CG1 may include at least one selected from a boron trichloride ($BCl_3$) gas, a titanium (III) chloride ($TiCl_3$) gas, and a dimethylaluminum chloride ($AlCl(CH_3)_2$) gas. In the first gas supplying operation S21, a pressure within the process tube 3 may range from about 10 kPa to about 30 kPa, but the disclosure is not limited thereto.

The first gas CG1 may remove a material deposited in the process tube 3. For example, the first gas CG1 may remove a first material MT1 deposited on the inner surface of the inner tube 33. The first material MT1 may include, for example, aluminum oxide ($Al_2O_3$). The removal of the first material MT1 by the first gas CG1 may be performed by the following equation.

$$Al_2O_3+BCl_3 \rightarrow AlCl_3(g)+B_2O_3(s)$$

A byproduct may be produced during the removal of the first material MT1 by the first gas CG1. The byproduct may be called a second material. For example, the second material may include boric oxide ($B_2O_3$). The second material may be piled up in the process tube 3. For example, the second material may be stacked on the inner surface of the inner tube 33.

Referring back to FIG. 7, the purge gas supplying operation S3 may be performed after the first gas supplying operation S21. The purge gas may include an inert gas (or a noble gas). For example, the purge gas may include at least one of a nitrogen ($N_2$) gas, a carbon dioxide ($CO_2$) gas, and an argon (Ar) gas. The purge gas may remove the first gas CG1 from the substrate processing apparatus SA.

Figure 16:
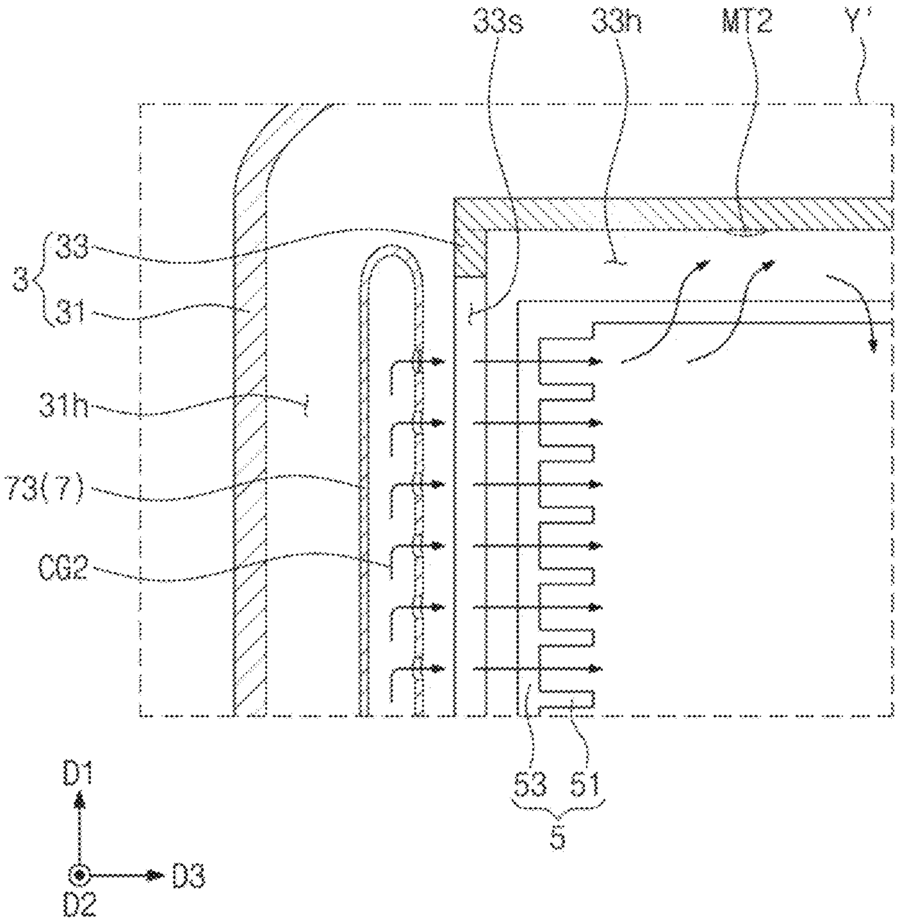
Figure 17:
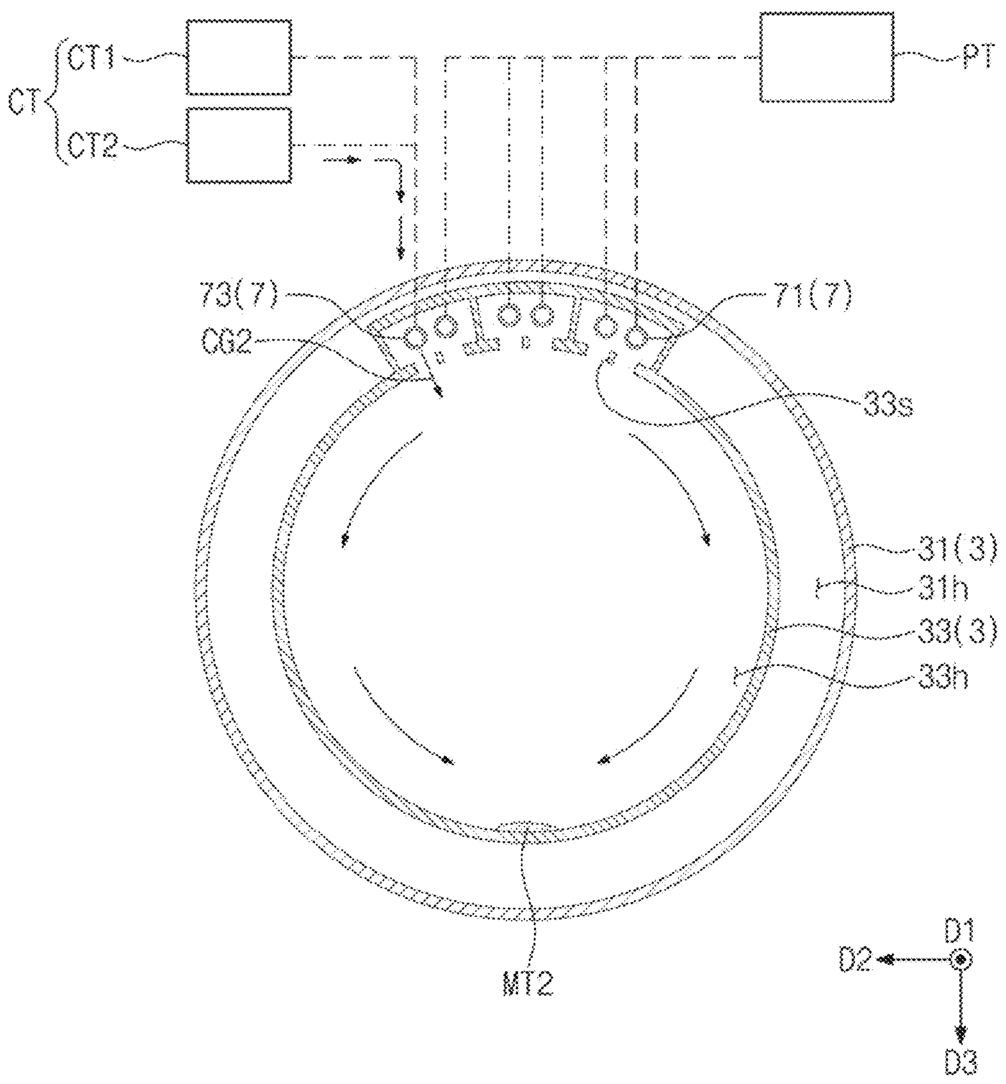

Referring to FIGS. 7, 16, and 17, the second gas supplying operation S41 may include an operation of allowing the process tube 3 to receive a second gas CG2 supplied through the cleaning gas nozzle 73 from the second cleaning gas tank CT2. The second gas CG2 may be a cleaning gas. The second gas CG2 may include a fluorine-based gas. For example, the second gas CG2 may include at least one selected from a nitrogen trifluoride ($NF_3$) gas, a hydrogen fluoride (HF) gas, a xenon difluoride ($XeF_2$) gas, and a sulfur tetrafluoride ($SF_4$) gas.

The second gas CG2 may remove a material deposited in the process tube 3. For example, the second gas CG2 may remove a second material MT2 deposited on the inner surface of the inner tube 33. For example, the second material MT2 may include boric oxide ($B_2O_3$). The removal of the second material MT2 by the second gas CG2 may be performed by the following equation.

$$B_2O_3(s)+NF_3 \rightarrow BF_3(g)+N_2O(g)$$

Therefore, during a process performed on the first substrate WF, it may be possible to remove both the first material MT1 deposited in the process tube 3 and the second material MT2 produced while the first material MT1 is removed.

It is described an example where the first gas CG1 includes a chlorine-based gas and the second gas CG2 includes a fluorine-based gas, but the disclosure is not limited thereto. For example, the first gas CG1 may include a fluorine-based gas, and the second gas CG2 may include a chlorine-based gas. In this case, the first material MT1 may include hafnium (IV) oxide ($HfO_2$), and the second material MT2 may include hafnium fluoride ($HfF_4$).

Figure 18:
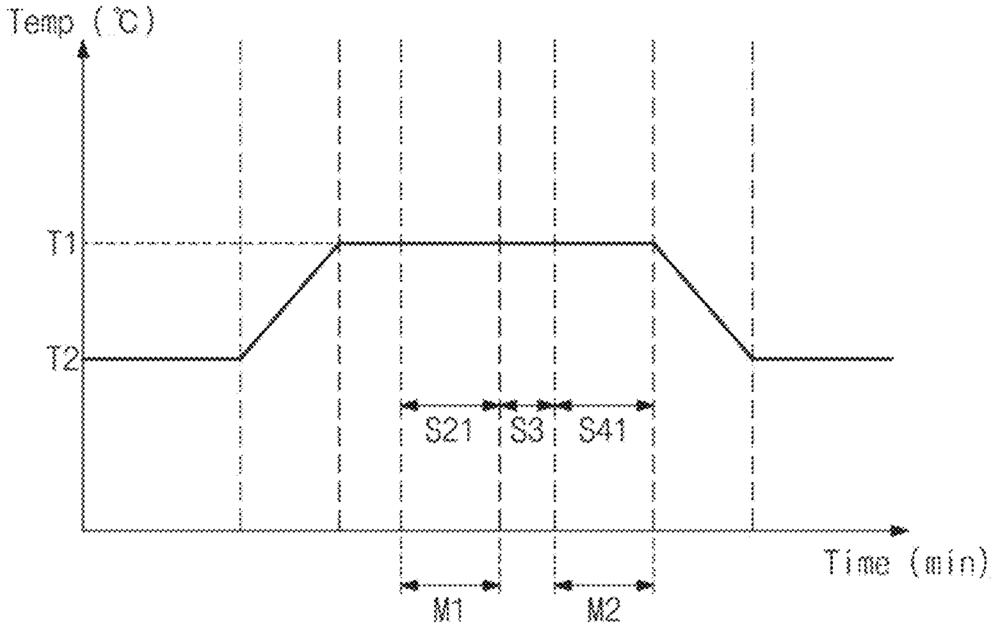
FIG. 18 illustrates a graph showing a substrate processing apparatus cleaning method according to the flow chart of FIG. 7.

FIG. 18 illustrates a graph showing a method of cleaning a substrate processing apparatus according to the flow chart of FIG. 7.

Referring to FIG. 18, a horizontal axis may indicate time. A unit of the horizontal axis may be minute. A vertical axis may denote temperature. A unit of the vertical axis may be Celsius (° C.).

Referring to FIGS. 7 and 18, the substrate processing apparatus cleaning method Sb may be performed at a first temperature. The substrate processing method Sa may further include an operation of heating the process tube 3 after the first substrate processing operation Sa1 and before the first gas supplying operation S21. The heating of the process tube 3 may be performed by the heater 2. The heater 2 may cause that a temperature within the process tube 3 may rise from a second temperature T2 to a first temperature T1. The first temperature T1 may be greater than the second temperature T2. For example, the substrate processing apparatus cleaning operation (see Sa2 of FIG. 6) may be performed at a temperature greater than that of the first substrate processing operation Sa1. The first temperature T1 may range, for example, from about 450° C. to about 600° C. For example, the substrate processing apparatus cleaning operation Sa2 may be a thermal process performed at high temperatures.

The first gas supplying operation S21 may continue for a first time length M1. The second gas supplying operation S41 may continue for a second time length M2. The first time length M1 may be greater than the second time length M2. The first material MT1 may be piled up during a process performed on the first substrate WF. The second material MT2 may be produced in the middle of removing the first material MT1. Therefore, an amount of the second material MT2 piled up in the process tube 3 may be less than that of the first material MT1. For example, an amount of the first material MT1 may be greater than that of the second material MT2. It may thus be required that the first time length M1 be greater than the second time length M2. For example, the first time length M1 may range, for example, for about 5 minutes to about 120 minutes.

Referring back to FIG. 6, the second substrate processing operation Sa3 may be performed after the substrate processing apparatus cleaning operation Sa2. The second substrate processing operation Sa3 may be substantially the same as or similar to the first substrate processing operation Sa1. For example, the substrate processing apparatus SA that has experienced a cleaning process may be used to repeatedly perform the same process on a second substrate other than the first substrate WF.

The first gas supplying operation S21 may be performed only once between the first substrate processing operation Sa1 and the second substrate processing operation Sa3. For example, as shown in FIG. 18, the first gas supplying operation S21 and the second gas supplying operation S41 may each be performed only once. The disclosure, however, are not limited thereto.

According to a substrate processing apparatus, a substrate processing apparatus cleaning method, and a substrate processing method including the same in accordance with some embodiments of the disclosure, a material deposited in a process tube may be removed during a process performed on a substrate. For example, without any need for people to directly enter the process tube, an automated process may be used to promptly remove the material deposited in the process tube. The process time may then decrease.

According to a substrate processing apparatus, a substrate processing apparatus cleaning method, and a substrate processing method including the same in accordance with some embodiments of the disclosure, other cleaning gas may be used to remove byproducts occurring in the middle of removing a material deposited in a process tube during a process performed on a substrate. For example, an automated process may be utilized to remove all kinds of material piled up in the process tube.

According to a substrate processing apparatus, a substrate processing apparatus cleaning method, and a substrate processing method including the same in accordance with some embodiments of the disclosure, a heater combined with a process chamber may be used to heat a process tube to high temperatures to achieve a temperature appropriate for a cleaning process. In addition, a process time of second gas may be reduced to decrease an entire process time.

Figure 19:
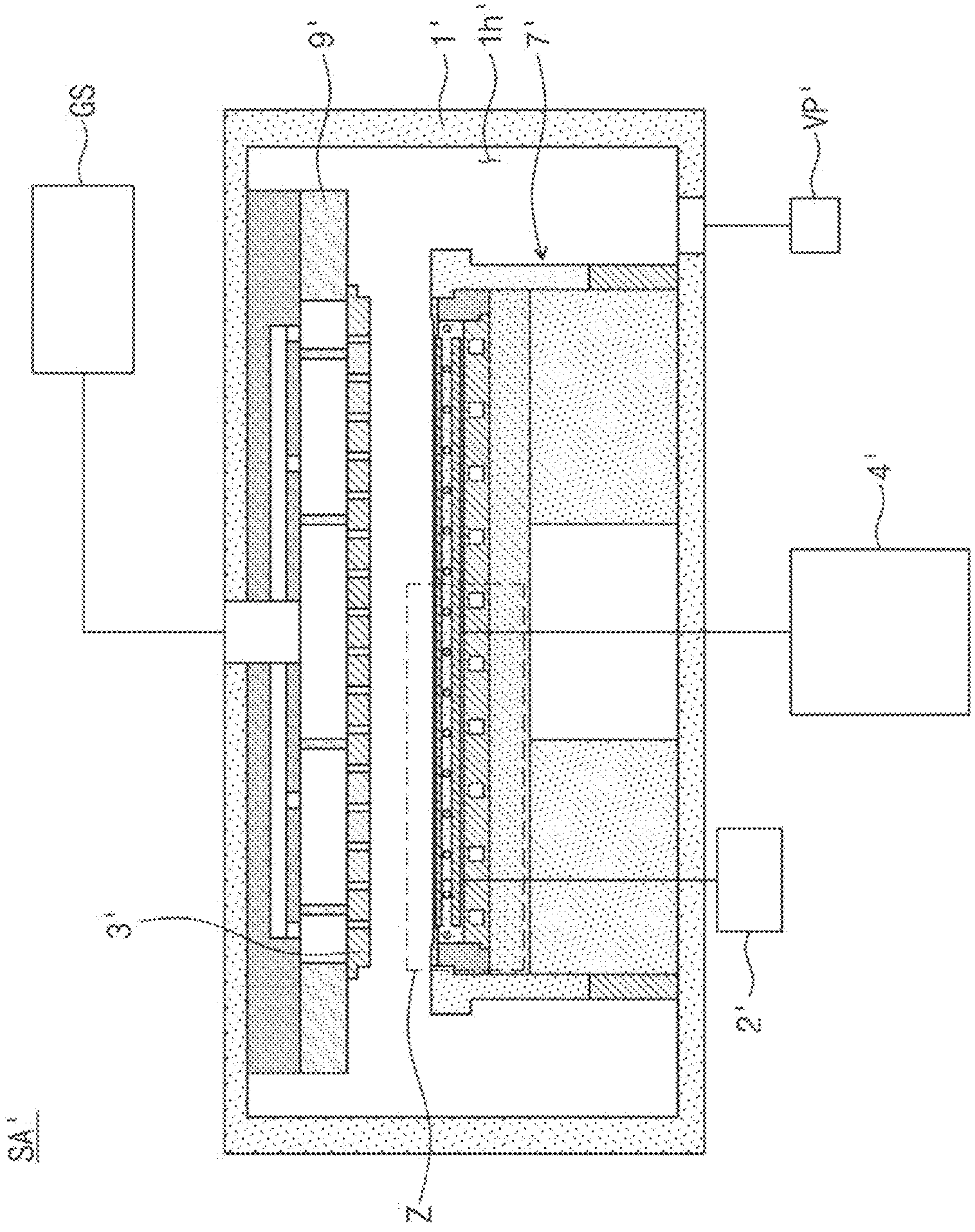
FIG. 19 illustrates a cross-sectional view showing a substrate processing apparatus according to some embodiments of the disclosure.
Figure 20:
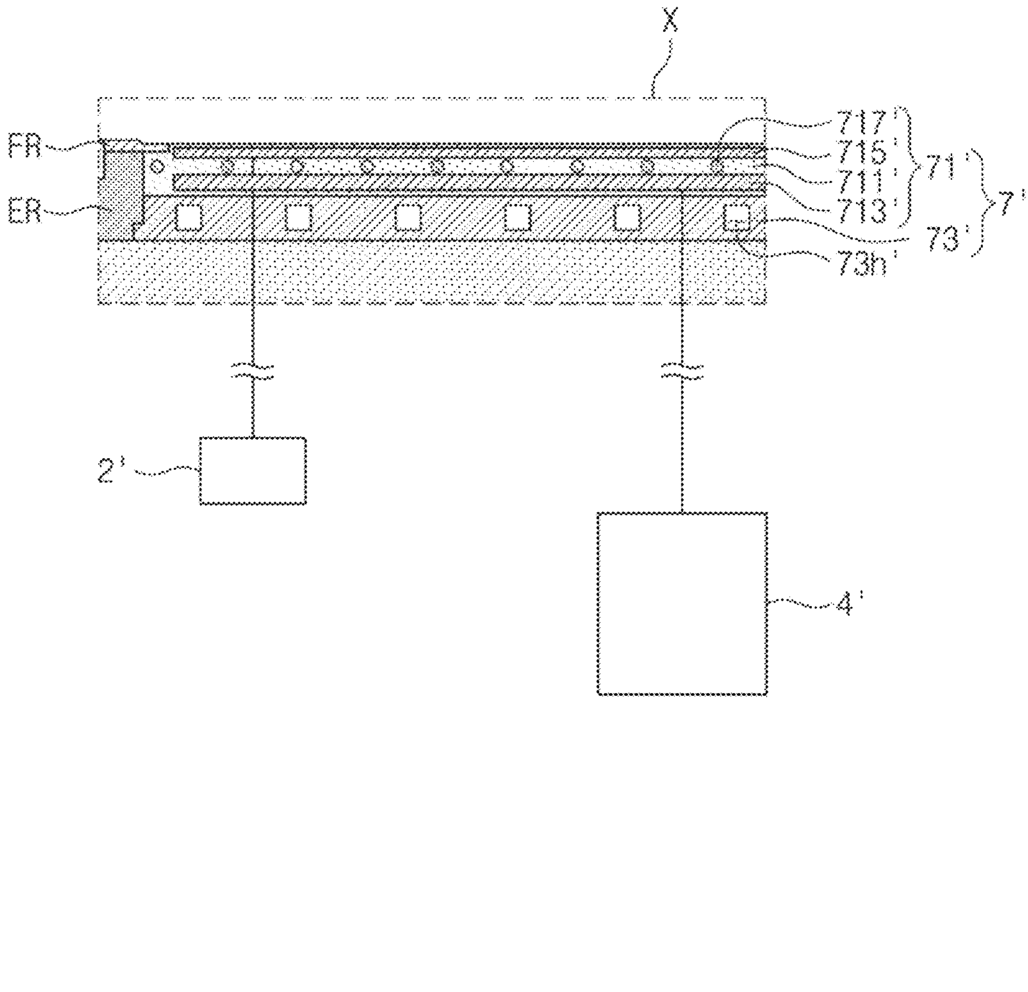
FIG. 20 illustrates an enlarged plan view showing section Z of FIG. 19.

FIG. 19 illustrates a cross-sectional view showing a substrate processing apparatus according to some embodiments of the disclosure. FIG. 20 illustrates an enlarged plan view showing section Z of FIG. 19.

The following will omit a description substantially the same as or similar to that discussed with reference to FIGS. 1 to 18.

Referring to FIGS. 19 and 20, a substrate processing apparatus SA' may be a facility of performing a process on a single substrate. For example, the substrate processing apparatus SA' may be a single-wafer type facility. The substrate processing apparatus SA' may include a process chamber 1', a stage 7', a showerhead 3', a direct-current (DC) power generator 2', a radio-frequency (RF) power generator 4', a vacuum pump VP', and a gas supply unit GS'.

The process chamber 1' may provide a process area 1*h*'. In the process area 1*h*', a process may be performed on a substrate. The process area 1*h*' may be separated from an external area. The process area 1*h*' may become a substantially vacuum state while a process is performed on a substrate. The process chamber 1' may have a cylindrical shape, but the disclosure is not limited thereto.

The stage 7' may be positioned in the process chamber 1'. For example, the stage 7' may be positioned in the process area 1*h*'. The stage 7' may support and/or fix a substrate. A substrate process may be performed in a state where a substrate is placed on the stage 7'. The stage 7' will be further discussed in detail below.

The showerhead 3' may be positioned in the process chamber 1'. For example, the showerhead 3' may be positioned in the process area 1*h*'. The showerhead 3' may be disposed upwardly spaced apart from the stage 7'. For example, a fixing member 9' may rigidly place the showerhead 3' on a certain position in the process area 1*h*'. A gas supplied from the gas supply unit GS' may be uniformly sprayed through the showerhead 3' into the process area 1*h'*.

The DC power generator 2' may apply a DC power to the stage 7'. The DC power applied from the DC power generator 2' may rigidly place a substrate on a certain position on the stage 7'.

The RF power generator 4' may supply the stage 7' with a RF power. It may thus be possible to control plasma in the process area 1*h'*.

The vacuum pump VP' may be connected to the process area 1*h*'. The vacuum pump VP' may apply a vacuum pressure to the process area 1*h*' during a substrate process.

The gas supply unit GS' may supply the process area 1*h*' with gas. The gas supply unit GS' may include a gas tank, a compressor, and a valve. The plasma may be generated from a portion of gas supplied from the gas supply unit GS' to the process area 1*h'*.

The stage 7' may use an electrostatic force to fix a substrate on a certain position. In this case, the stage 7' may include an electrostatic chuck (ESC). The stage 7' may include a chuck 71' and a cooling plate 73'.

A substrate may be disposed on the chuck 71'. The chuck 71' may fix a substrate on a certain position. The chuck 71' may include a chuck body 711', a plasma electrode 713', a chuck electrode 715', and a heater 717'.

The chuck body 711' may have a cylindrical shape. The chuck body 711' may include a ceramic, but the disclosure is not limited thereto. A substrate may be disposed on a top surface of the chuck body 711'. The chuck body 711 may be surrounded by at least one of a focus ring FR and an edge ring ER.

The plasma electrode 713' may be positioned in the chuck body 711'. The plasma electrode 713' may include aluminum (Al). The plasma electrode 713' may have a disk shape, but the disclosure is not limited thereto. A RF power may be applied to the plasma electrode 713'. For example, the RF power generator 4' may apply the RF power to the plasma electrode 713'. The RF power applied to the plasma electrode 713' may control plasma in the process area (see 1*h*' of FIG. 1).

The chuck electrode 715' may be positioned in the chuck body 711'. The chuck electrode 715' may be positioned higher than the plasma electrode 713'. A DC power may be applied to the chuck electrode 715'. For example, the DC power generator 2' may apply the DC power to the chuck electrode 715'. The DC power applied to the chuck electrode 715' may fix a substrate on a certain position on the chuck body 711'. The chuck electrode 715' may include aluminum (Al), but the disclosure is not limited thereto.

The heater 717' may be positioned in the chuck body 711'. The heater 717' may be positioned between the chuck electrode 715' and the plasma electrode 713'. The heater 717' may include a hot wire. For example, the heater 717' may include a concentrically circular shaped hot wire. The heater 717' may radiate heat to the surrounding environment. Therefore, the chuck body 711' may have an increased temperature.

The cooling plate 73' may be positioned below the chuck 71'. For example, the chuck 71' may be positioned on the cooling plate 73'. The cooling plate 73' may provide a cooling hole 73*h*'. Cooling water may flow in the cooling hole 73*h*'. The cooling water in the cooling hole 73*h*' may absorb heat from the cooling plate 73'.

According to a substrate processing apparatus, a substrate processing apparatus cleaning method, and a substrate processing method including the same in accordance with some embodiments of the disclosure, an automated process may be performed even in a single-wafer type facility.

According to a substrate processing apparatus, a substrate processing apparatus cleaning method, and a substrate processing method including the same of the disclosure, a process performed on a substrate may remove a material deposited in a tube.

According to a substrate processing apparatus, a substrate processing apparatus cleaning method, and a substrate processing method including the same of the disclosure, other deposited materials may also be removed which are produced in the middle of removing a material deposited in a tube.

According to a substrate processing apparatus, a substrate processing apparatus cleaning method, and a substrate processing method including the same of the disclosure, it may be possible to reduce a time required for a cleaning process.

Effects of the disclosure are not limited to the mentioned above, other effects which have not been mentioned above will be clearly understood to those skilled in the art from the following description.

Although the disclosure have been described in connection with some embodiments of the disclosure illustrated in the accompanying drawings, it will be understood to those skilled in the art that various changes and modifications may be made without departing from the technical spirit and essential feature of the disclosure. It therefore will be understood that the embodiments described above are just illustrative but not limitative in all aspects.

What is claimed is:

1. A substrate processing apparatus cleaning method comprising:

inserting a boat into a process tube;

removing, by performing a first removal process, a first material deposited in the process tube; and removing, by performing a second removal process, a second material deposited in the process tube by the first removal process, wherein the first removal process comprises supplying the process tube with a first gas, wherein the second removal process comprises supplying the process tube with a second gas, wherein one of the first gas and the second gas comprises a chlorine-based gas, wherein the other of the first gas and the second gas comprises a fluorine-based gas, and wherein the chlorine-based gas comprises a titanium (III) chloride ($TiCl_3$) gas.

2. The substrate processing apparatus cleaning method of claim 1, wherein the first gas comprises the chlorine-based gas, the chlorine-based gas further comprises a boron trichloride ($BCl_3$) gas, wherein the first material comprises aluminum oxide ($Al_2O_3$), and wherein the second material comprises boric oxide ($B_2O_3$).

3. The substrate processing apparatus cleaning method of claim 1, wherein the fluorine-based gas comprises at least one of a nitrogen trifluoride ($NF_3$) gas, a hydrogen fluoride (HF) gas, a xenon difluoride ($XeF_2$) gas, and a sulfur tetrafluoride ($SF_4$) gas.

4. The substrate processing apparatus cleaning method of claim 1, wherein the first gas comprises the fluorine-based gas, the fluorine-based gas comprises a nitrogen trifluoride ($NF_3$) gas, wherein the first material comprises hafnium (IV) oxide ($HfO_2$), and wherein the second material comprises hafnium fluoride ($HfF_4$).

5. The substrate processing apparatus cleaning method of claim 1, wherein the boat comprises a plurality of substrate support members, wherein at least one of the plurality of substrate support members is configured to support a substrate, wherein the plurality of substrate support members are vertically spaced apart from each other, and wherein, when the boat is inserted into the process tube, the substrate is not on the boat.

6. The substrate processing apparatus cleaning method of claim 1, wherein the supplying the process tube with the first gas is performed for a first time length, wherein the supplying the process tube with the second gas is performed for a second time length, and wherein the first time length is greater than the second time length.

7. The substrate processing apparatus cleaning method of claim 6, wherein the first time length is in a range of about 5 minutes to about 120 minutes.

8. The substrate processing apparatus cleaning method of claim 1, wherein the first removal process is performed at a first temperature, and wherein the first temperature is in a range of about 450° C. to about 600° C.

9. The substrate processing apparatus cleaning method of claim 1, further comprising supplying the process tube with a purge gas, after the supplying the process tube with the first gas and before the supplying the process tube with the second gas.

10. The substrate processing apparatus cleaning method of claim 1, wherein the chlorine-based gas further comprises a dimethylaluminum chloride ($AlCl(CH_3)_2$) gas.

11. A substrate processing method comprising:

processing a first substrate by using a substrate processing apparatus; and after processing the first substrate, unloading the first substrate from the substrate processing apparatus and then cleaning the substrate processing apparatus, wherein the cleaning the substrate processing apparatus comprises:

supplying a first gas to the substrate processing apparatus to remove a first material deposited in the substrate processing apparatus, wherein the first gas comprises a chlorine-based gas comprising a titanium (III) chloride ($TiCl_3$) gas;

after the supplying the first gas, removing the first gas from the substrate processing apparatus by supplying the substrate processing apparatus with a purge gas; and after the removing the first gas, supplying the substrate processing apparatus with a second gas to remove a second material deposited in the substrate processing apparatus, wherein the second material is produced during the removal of the first material by the first gas, and wherein the second gas comprises a fluorine-based gas.

12. The substrate processing method of claim 11, wherein the supplying the first gas to the substrate processing apparatus is performed at a first temperature, wherein the processing the first substrate is performed at a second temperature, wherein the first temperature is greater than the second temperature.

13. The substrate processing method of claim 11, wherein the substrate processing apparatus comprises:

a process tube comprising a process area; and a boat selectively inserted into the process area, wherein the boat comprises a plurality of substrate support members vertically spaced apart from each other, wherein the processing the first substrate is performed in a first state where the process tube receives the boat in which the first substrate is disposed, and wherein the supplying the first gas to the substrate processing apparatus is performed in a second state where the boat is inserted into the process area.

14. The substrate processing method of claim 13, wherein, when the substrate processing apparatus is supplied with the first gas, a pressure within the process tube is in a range of about 10 kPa to about 30 kPa.

15. The substrate processing method of claim 13, further comprising heating the process tube, after the processing the first substrate and before the supplying the first gas to the substrate processing apparatus, wherein the heating the process tube is performed by a heater positioned outside the process tube.

16. The substrate processing method of claim 11, further comprising processing a second substrate by using the substrate processing apparatus, after cleaning the substrate processing apparatus.

17. The substrate processing method of claim 16, wherein the supplying the first gas to the substrate processing apparatus is performed only once between the processing the first substrate and the processing the second substrate.

18. The substrate processing method of claim 11, wherein, when the substrate processing apparatus is cleaned, no substrate is disposed in the substrate processing apparatus.

19. A substrate processing apparatus comprising:

a process tube comprising a process area;

a boat selectively inserted into the process area;

at least one process gas nozzle comprising a plurality of process gas holes vertically spaced apart from each other;

a cleaning gas nozzle comprising a plurality of cleaning gas holes vertically spaced apart from each other;

a process gas tank connected to the at least one process gas nozzle and configured to supply the at least one process gas nozzle with a process gas;

a cleaning gas tank connected to the cleaning gas nozzle and configured to supply the cleaning gas nozzle with a cleaning gas, wherein the cleaning gas tank is configured to store a chlorine-based gas and a fluorine-based gas; and a controller programmed to perform a substrate processing apparatus cleaning method according to claim 1.

20. The substrate processing apparatus of claim 19, wherein the at least one process gas nozzle corresponds to five process gas nozzles, wherein the five process gas nozzles are spaced apart from each other in a horizontal direction, wherein the cleaning gas nozzle comprises:

a first cleaning gas nozzle; and a second cleaning gas nozzle spaced apart in the horizontal direction from the first cleaning gas nozzle, and wherein the cleaning gas tank comprises:

a first cleaning gas tank configured to supply the first cleaning gas nozzle with the chlorine-based gas; and a second cleaning gas tank configured to supply the second cleaning gas nozzle with the fluorine-based gas.

* * * * *